United States Patent
Caimi et al.

(10) Patent No.: US 11,852,676 B2
(45) Date of Patent: Dec. 26, 2023

(54) INTEGRATED CIRCUIT WITH REFERENCE SUB-SYSTEM FOR TESTING AND REPLACEMENT

(71) Applicant: STMICROELECTRONICS S.R.L., Agrate Brianza (IT)

(72) Inventors: Carlo Caimi, Cinisello Balsamo (IT); Massimiliano Pesaturo, Torre de' Roveri (IT); Stefano Antonio Mastrorosa, Milan (IT); Alfredo Lorenzo Poli, Pontida (IT); Marco Della Seta, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 24 days.

(21) Appl. No.: 17/672,588

(22) Filed: Feb. 15, 2022

(65) Prior Publication Data
US 2023/0258709 A1    Aug. 17, 2023

(51) Int. Cl.
*G01R 31/28* (2006.01)
*G01R 31/00* (2006.01)
*G01R 31/317* (2006.01)
*G01R 31/3187* (2006.01)
*G01R 31/3185* (2006.01)

(52) U.S. Cl.
CPC ....... *G01R 31/2856* (2013.01); *G01R 31/007* (2013.01); *G01R 31/3187* (2013.01); *G01R 31/31703* (2013.01); *G01R 31/31724* (2013.01); *G01R 31/318525* (2013.01)

(58) Field of Classification Search
CPC .... G01R 35/00; G01R 31/3835; G01R 31/54; G01R 31/3177; G01R 31/2851; G01R 31/318555; G01R 31/52; G01R 31/3187; G01R 31/36; G01R 31/2856; G01R 31/3842; G01R 31/31724; G01R 31/28; G01R 19/0038; G01R 31/318566; G01R 19/16566; G01R 31/3004; G01R 31/2896; G01R 31/3012; G01R 31/31704; G01R 31/3181; G01R 1/0491; G01R 25/005; G01R 31/2642; G01R 31/2818; G01R 19/2506; G01R 29/0878; G01R 31/2836; G01R 31/317; G01R 31/282; G01R 31/316; B60R 21/0173; B60R 16/0232; B60R 21/01; B60R 16/0239; B60R 2021/01184
See application file for complete search history.

(56) References Cited

U.S. PATENT DOCUMENTS

| | | | | |
|---|---|---|---|---|
| 5,905,855 A | * | 5/1999 | Klaiber | G06F 11/3688 714/37 |
| 6,556,952 B1 | * | 4/2003 | Magro | G06F 11/3409 702/182 |

(Continued)

*Primary Examiner* — Vinh P Nguyen
(74) *Attorney, Agent, or Firm* — Seed IP Law Group LLP

(57) ABSTRACT

An integrated circuit includes a sub-system and a reference sub-system. The reference sub-system is substantially identical to the sub-system but is non-operating by default. The integrated circuit includes a test circuit that obtains a parameter value of the sub-system and a reference parameter from the reference sub-system. The integrated circuit detects deterioration of the sub-system based on the parameter value and the reference parameter. The integrated circuit deactivates the sub-system and activates the reference sub-system responsive to detecting deterioration of the sub-system.

16 Claims, 5 Drawing Sheets

(56) References Cited

U.S. PATENT DOCUMENTS

| | | | |
|---|---|---|---|
| 6,986,086 B2 | 1/2006 | Scholten | |
| 8,081,003 B2* | 12/2011 | Pacha | G01R 31/3181 |
| | | | 324/76.41 |
| 9,229,051 B2* | 1/2016 | Sharma | G01R 31/2884 |
| 9,494,641 B2* | 11/2016 | Smith | G01R 31/2837 |
| 9,865,362 B1* | 1/2018 | Arora | G11C 29/02 |
| 9,990,212 B2 | 6/2018 | Kruglick | |
| 11,287,467 B2* | 3/2022 | Sutaria | G01R 31/2879 |
| 2003/0141887 A1 | 7/2003 | Briere | |
| 2010/0194400 A1 | 8/2010 | Baumann et al. | |
| 2014/0218060 A1 | 8/2014 | Saneyoshi | |

* cited by examiner

INTEGRATED CIRCUIT WITH REFERENCE SUB-SYSTEM FOR TESTING AND REPLACEMENT

BACKGROUND

Technical Field

The present disclosure is related to integrated circuits, and more particularly, to improving the reliability and resilience of integrated circuits.

Description of the Related Art

Integrated circuits often include various components, systems, or sub-systems. Over the course of time, it is possible that components or sub-systems of an integrated circuit may deteriorate. For some integrated circuit implementations, it may be particularly desirable to avoid degradation or failure of certain sub-systems. For example, integrated circuits may be utilized within vehicles or medical devices. Failure of a component or sub-system of the integrated circuits could result in malfunction of the medical devices or the vehicles.

Efforts have been made to reduce the possibility that components or sub-systems of an integrated circuit can fail. Nevertheless, it can be very difficult to ensure that no failures occur within components or sub-systems of an integrated circuit in sensitive applications. In particular, after many usage cycles of an integrated circuit, deterioration may occur even in very well-designed components and sub-systems.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit with improved reliability. The integrated circuit includes a sub-system or elementary structure. The integrated circuit also includes a reference sub-system or reference elementary structure that, by default, is not in use. The reference sub-system or elementary structure is similar or substantially identical to the sub-system or elementary structure. The integrated circuit checks parameters of the sub-system or elementary structure and compares them to parameters of the reference sub-system or reference elementary structure. The integrated circuit can determine whether or not the sub-system or elementary structure has deteriorated over time based on the comparisons. A substantial deterioration has occurred, the integrated circuit may determine that there is a risk of failure of the sub-system or elementary structure. The integrated circuit disables the sub-system or elementary structure and enables the reference sub-system or reference elementary structure and function in place of the sub-system or elementary structure.

Embodiments of the present disclosure provide various benefits. For example, deterioration of sub-systems or elementary structures is detected before failure occurs. After deterioration or imminent failure has been detected, the lifetime of the integrated circuit can be continued by activating or enabling the reference sub-system or reference elementary structure to function in place of the deteriorated sub-system or elementary structure. This ensures that integrated circuits, and in particular, sensitive sub-systems or components do not fail. This further promotes the reliability of devices or systems in which the integrated circuits are installed.

In one embodiment, an integrated circuit includes a sub-system, a reference sub-system, and a test circuit coupled to the sub-system and the reference sub-system and configured to obtain a parameter value from the sub-system and a reference parameter value from the reference sub-system. The integrated circuit further includes a control circuit coupled to the test circuit and configured to compare the parameter value to the reference parameter value.

In one embodiment, an integrated circuit includes a sub-system including an elementary structure, a reference elementary structure, and a test circuit coupled to the sub-system and the reference elementary structure and configured to measure a parameter of the elementary structure and to measure a reference parameter of the reference elementary structure. The integrated circuit further includes a control circuit coupled to the test circuit and configured to determine whether the elementary structure has deteriorated based on the parameter and the reference parameter.

In one embodiment, a method includes operating a sub-system of an integrated circuit and measuring a parameter of the sub-system while the sub-system is operating the method includes measuring a reference parameter of a reference sub-system of the integrated circuit and determining whether the sub-system has deteriorated by comparing the parameter to the reference parameter.

In one embodiment, a vehicle includes an integrated circuit. The integrated circuit includes a sensor system, a reference system capable of performing a function of the sensor system, and a control circuit. The control circuit is configured to obtain a parameter of the sensor sub-system while the system is operating, obtain a reference parameter of the reference system, and detect deterioration of the sensor sub-system based on the parameter and the reference parameter. The control circuit is configured to deactivate the sensor system if control circuit detects deterioration and activate the reference system in place of the sensor sub-system if the control signal detects deterioration of the sensor system.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
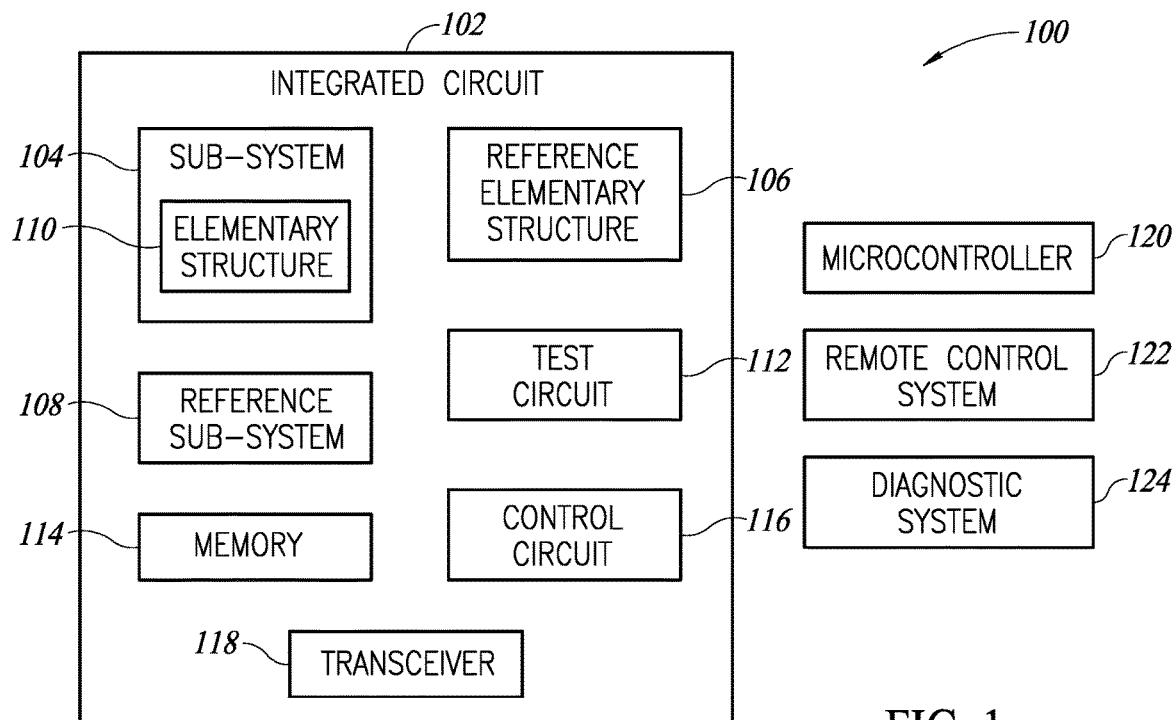
FIG. 1 is a block diagram of a system including and integrated circuit, according to one embodiment.

FIG. 1 is a block diagram of a system 100 including an integrated circuit 102, according to one embodiment. The integrated circuit includes a sub-system 104 and a reference sub-system 108. As will be set forth in more detail below, the components of the integrated circuit 102 cooperate to detect deterioration in the sub-system 102 prior to failure of the sub-system 102. The components of the integrated circuit 102 cooperate to deactivate the sub-system 104 and to activate the reference sub-system 108 in place of the sub-system 104 when deterioration is detected. In this way, the integrated circuit 102 can seamlessly continue to function after deterioration of the sub-system 104.

The system 100 may include sensitive features, components, or devices. The system 100 may rely on the integrated circuit 102 to perform various functions. For example, the system 100 may rely on the integrated circuit 102 as part of a sensor system, as a data processing system, a control system, or for other purposes. If the integrated circuit 102 is not able to properly perform the desired functions, then the system 100, or features, components, or devices of the system 100 likewise may not properly perform the desired functions.

In one embodiment, the system 100 is a vehicle. The vehicle may include an automobile, an aircraft, a watercraft, or other types of vehicles. The integrated circuit 102 is installed within the vehicle. The vehicle may include driver assistance features such as breaking assistance, drift correction, anti-collision, or self-driving features. The integrated circuit 102 may perform one or more functions in these driver assistance features. Due to the reference sub-system 108 and corresponding testing functions, as will be set forth in more detail below, the integrated circuit 102 is able to function reliably. The integrated circuit 102 is able to detect a risk of failure and to activate the reference sub-system 108 to ensure that proper function of the integrated circuit 102 is maintained without any deleterious effects to the vehicle.

In one embodiment, the system 100 is a medical device. The medical device may include a pacemaker, a heart rate monitor, an EKG system, an automated medication delivery system, or other types of medical devices. The integrated circuit 102 is installed within the medical device. The medical device may rely on the integrated circuit 102 to perform sensitive functions related to the overall design and purpose of the medical device. Due to the reference sub-system 108 and corresponding testing functions, as will be set forth in more detail below, the integrated circuit 102 is able to function reliably. This further ensures that the medical device will function reliably.

In one embodiment, the sub-system 104 is a sensor system or is part of a sensor system. In the example of a vehicle, the sub-system 104 may be part of an object detection system. The sub-system 104 may be part of a radar system, a LIDAR system, an infrared detection system, an ultraviolet detection system, a visible light detection system, or other types of detection systems. These systems may enable the vehicle to detect objects in the vicinity of the vehicle. These systems may be utilized by the vehicle to perform driver assistance of functions, such as those described above. In the example of a medical device, the sub-system 104 may be part of a system that senses fluid flow rates of a medication, signals related to a heartbeat, respiration parameters, or other types of signals or parameters associated with a function of a medical device.

The sub-system 104 may perform signal processing functions, data processing functions, or other types of functions related to a sensor system of a vehicle or medical device. Some components of the sensor system may be external to the integrated circuit 102. These components may provide signals or data to the sub-system 104 for processing. Alternatively, the sub-system 104 may be utilized in other ways in a vehicle or medical device.

While some embodiments discussed herein are related to vehicles or medical devices, the integrated circuit 102 can be part of other systems or devices. For example, the integrated circuit 102 may be part of a communication system, a smart phone, a smartwatch, a tablet, a desktop computer, a laptop computer, or other types of systems or electronic devices.

The reference sub-system 108 may be substantially identical to the sub-system 104. The reference sub-system 108 is not active within the integrated circuit 102 by default. The reference sub-system 108 has similar or identical capability as the sub-system 104. In other words, the reference sub-system 108 may be designed to perform the same or similar functions as the sub-system 104.

Because the reference sub-system 108 is not activated within the integrated circuit 102, the reference sub-system 108 does not undergo all the same stresses as does the sub-system 104. The sub-system 104 is activated by default within the integrated circuit 102. As such, throughout the life of the integrated circuit 102, the sub-system 104 may undergo thermal cycling, may carry large currents, may be subjected to temperature variations, pressure variations, high voltages, cycles of charging and discharging, or other factors that may stress the sub-system 104. It is possible that over a long period of time, the function of the sub-system 104 will deteriorate. However, because the reference system 108 is not active, the reference sub-system 108 does not undergo the same stresses. Accordingly, the reference sub-system 108 may deteriorate at a significantly slower rate than the sub-system 104. As will be set forth I more detail below, the integrated circuit 102 utilizes the reference sub-system 108 as a way to detect if the sub-system 104 has deteriorated.

The sub-system 104 may include an elementary structure 110. As used herein, the term "elementary structure" may include basic circuit components. The basic circuit components can include, but are not limited to, a capacitor, a transistor, a diode, a resistor, a signal line, a flip-flop, an individual memory cell, or other basic circuit components.

The function of the sub-system 104 may rely on proper function of the elementary structure 110. As will be set forth in more detail below, the integrated circuit 102 can monitor parameters of the elementary structure 110 in order to detect deterioration of the elementary structure 110. The integrated circuit 102 can detect that there is a risk of failure of the elementary structure 110 based on detecting deterioration of the elementary structure 110.

The integrated circuit 102 includes a reference elementary structure 106. The reference elementary structure 106 may include a same or similar structure and composition as the elementary structure 110. The reference elementary structure is not activated within the integrated circuit 102 by default. Instead, the elementary structure 110 is active by default.

Because the elementary structure 110 is active by default in the integrated circuit 102, the elementary structure 110 undergoes various stresses while the integrated circuit 102 is in use. The elementary structure 110 may undergo thermal cycles, cycles of electrical charging and discharging, pressure changes, temperature changes, high electrical currents, voltage fluctuations, and other types of stresses. Over a large period of time, the stresses may cause the elementary structure 110 to deteriorate.

Because the reference elementary structure is not active by default in the integrated circuit 102, the reference elementary structure 106 is not subjected to the same stresses as the elementary structure 110. Accordingly, the reference elementary structure 106 may not deteriorate in the same manner as the elementary structure 110. This enables the reference elementary structure 106 to be utilized as a reference for detecting deterioration of the elementary structure 110.

FIG. 1 illustrates the reference elementary structure 106 as being separate from the reference sub-system 108. However, in one embodiment, the reference elementary structure 106 may be part of the reference sub-system 108. Alternatively, the reference elementary structure 106 may be separate from the reference sub-system 108.

In one embodiment, the control circuit 116 is configured to determine or detect whether or not the sub-system 104 has deteriorated. The control circuit 116 utilizes the test circuit 112 to detect deterioration of the sub-system 104, as will be set forth in more detail below. While the test circuit 112 is shown as being separate from the control circuit 116, in practice, the test circuit 112 may either be part of the control circuit 116 or may be separate from the control circuit 116.

In one embodiment, the test circuit 112 is configured to obtain a parameter value associated with the sub-system 104. The parameter value can include a value of a sensor signal, a voltage value associated with the sub-system 104, a capacitance value associated with the sub-system 104, a resistance value associated with the sub-system 104, a current value associated with the sub-system 104, or other types of physical parameters associated with the sub-system 104. In one example, the sub-system 104 is configured to generate a reference voltage. The parameter value obtained by the test circuit 112 may be reference voltage.

The test circuit 112 is also configured to obtain a reference parameter value associated with the reference sub-system 108. The reference parameter value is the same type of parameter value as the parameter value obtained by the test circuit 112 from the sub-system 104. For example, if the test circuit 112 obtains a reference voltage as the parameter value from the sub-system 104, the test circuit 112 will also obtain a reference voltage from the reference sub-system 108 as the reference parameter value. The reference parameter value can include the same types of parameters obtained from the sub-system 104

The test circuit 112 passes the parameter value and the reference parameter value to the control circuit 116. The control circuit 116 analyzes the parameter and the reference parameter value in order to determine whether or not the sub-system 104 has deteriorated. The control circuit may detect deterioration of the sub-system 104 based on the difference between the parameter value obtained from the sub-system 104 and the reference parameter value obtained from the reference sub-system 108. The control circuit 116 may perform a simple comparison of the parameter value and the reference parameter value. Alternatively, the control system 116 may perform more complex analysis of the parameter value and the reference parameter value in order to detect deterioration of the sub-system 104.

In one embodiment, the control circuit 116 utilizes the memory 114 to assist in detecting deterioration of the sub-system 104. The control circuit 116 may utilize the memory 114 to store past values of the parameter value obtained from the sub-system 104 and the reference parameter value obtained from the reference sub-system 108. The control circuit 116 may periodically cause the test circuit 112 to obtain the parameter value from the sub-system 104 and to obtain the reference parameter value from the reference sub-system 108. Each time that the control circuit 116 obtains the parameter value and the reference parameter value, the control circuit 116 may store the parameter and the reference parameter in memory 114. Each time that the control circuit 116 obtains the parameter and the reference parameter value, the control circuit 116 may calculate the difference between the parameter value and the reference parameter value.

The memory 114 may act as a table having rows corresponding to dates or times at which the parameter and the reference parameter more obtained and compared. The table may have a column corresponding to the value of the parameter value, a column corresponding to the value of the reference parameter value, and a column corresponding to the difference between the parameter value and the reference parameter value.

The times at which the system starts deteriorating can be stored in the memory 114. The possibility to transmit times to failure externally, will allow to store significant amounts of data. This data set can be used to build degradation models for extrinsic failures directly from field data (failures not related to how the system has been designed but related to external events like overstress, defects activation etc.). The availability of this kind of data in semiconductor fields traditionally has been very poor due to the difficulties related to collecting and retrieving them.

The possibility to transmit times to failure externally provides access to data stored in memory even if some critical functions of the device are degraded or heavily impacted.

The control circuit 116 can detect deterioration of the sub-system 104 by detecting the drift between the values of the parameter value and the reference parameter value over time. As the sub-system 104 deteriorates over time, the difference between the parameter and the reference parameter value will grow larger over time. Accordingly, detecting the drift corresponds to detecting an increasing difference between the parameter value and the reference parameter value over time.

A principal utilized by the control circuit 116 a detecting deterioration is that the reference sub-system 108 will not undergo the same deterioration that the sub-system 104 will undergo because the sub-system 104 is active in the integrated circuit one a reference sub-system is not. Accordingly, parameter values associated with the reference sub-system 108 will not change as much overtime as parameter values associated with the sub-system 104. The drift of parameters associated with the sub-system 104 compared to parameters associated with the reference sub-system 108 can, therefore, give an indication of deterioration of the sub-system 104.

In one embodiment, the control circuit 116 utilizes a threshold value to determine whether or not the sub-system 104 has deteriorated to a level that failure or malfunction of the sub-system 104 can occur. The threshold value may correspond to a threshold difference between the parameter and the reference parameter. For example, if the parameter is a capacitance value, then the threshold value may correspond to a threshold difference in capacitance between the parameter and the reference parameter. Other types of thresholds can be utilized without departing from the scope of the present disclosure.

In one embodiment, the control circuit 116 determines that the sub-system 104 is at risk of malfunction based on the parameter obtained from the sub-system 104 and the reference parameter obtained from the reference sub-system 108, the control system 116 can deactivate the sub-system 104. When the control system 116 deactivates the sub-system 104, the control system 116 activates the reference sub-system 108 to operate in place of the sub-system 104. The control system 116 may open and close the various switches to electrically connect the reference sub-system 108 in place of the sub-system 104.

The control system 116 may detect deterioration of the elementary structure 110 in the same manner as described for detecting deterioration of the sub-system 104 in general. The control circuit 116 may cause the test circuit 112 to obtain a parameter value associated with the elementary structure 110. In an example in which the elementary structure 110 is a capacitor, the parameter value may be a value of the capacitance of the capacitor. In an example in which the elementary structure 110 is a resistor, the parameter value may be a value of the resistance of the resistor. In an example in which the elementary structure 110 is a transistor, the parameter value may be a voltage, a current, a transconductance, a capacitance, or another parameter associated with the transistor. The test circuit 112 also obtains a reference parameter value associated with the reference elementary structure 106. The test circuit 112 can analyze the parameter value and the reference parameter value in order to detect whether the elementary structure 110 has deteriorated.

The control circuit 116 can store in the memory 114 a series of parameter values and reference parameter values taken at various times, as well as difference values for each set of parameter value and reference parameter value. The control circuit 116 can detect deterioration of the sub-system 104 by detecting the drift over time between the parameter values associated with the sub-system 104 and the reference parameter values associated with the reference elementary structure 106. The control circuit 116 can utilize one or more threshold drift values or difference values in order to determine that the elementary structure 110 is in danger of malfunction.

If the control circuit determines that the elementary structure 110 is at risk of malfunction, the control circuit 116 can deactivate the elementary structure 110. The control circuit 116 can then activate the reference elementary structure 106 in place of the elementary structure 110. The control circuit 116 may open and close various switches within the integrated circuit 102 to electrically connect the reference elementary structure 106 in place of the elementary structure 110.

In one embodiment, if the control circuit 116 determines that the elementary structure 110 is at risk of malfunction, the control circuit 116 can deactivate the entire sub-system 104. The control circuit 116 can then activate the reference sub-system 108 that includes the reference elementary structure 106.

The integrated circuit 102 may include a transceiver 118. The integrated circuit 118 may communicate with one or more systems external to the integrated circuit 102. For example, the system 100 may include one or more of a microcontroller 120, a remote control system 122, and a diagnostic system 124. The transceiver 118 can transmit data to one or more of these external systems. The control circuit 116 can control the transceiver 118 to transmit parameter values associated with the sub-system 104, reference parameter values associated with the reference sub-system 108 or the reference elementary structure 106, difference values or drift values associated with the parameter values in the reference parameter values, and other data. The control circuit 116 can control the transceiver 118 to output a warning that deterioration of the sub-system 104 or of the elementary structure 110 has occurred. The control circuit 116 can control the transceiver 118 to output a warning that there is a risk of malfunction of the sub-system 104 or of the elementary structure 110. The control circuit 116 can control the transceiver 118 to output data indicating that the control circuit 116 has deactivated the sub-system 104 or the elementary structure 110 and has activated the reference elementary structure 106 or the reference sub-system 108. The control circuit 116 can also control the transceiver 118 to request instructions from the microcontroller 120, the remote control system 122 or the diagnostic system 124.

In one embodiment, after the control circuit 116 has determined that the sub-system 104 has deteriorated, the control circuit 116 causes the transceiver 118 to transmit data to the microcontroller 120. The data indicates to the microcontroller 120 that the sub-system 104 has been deactivated and that the reference sub-system 108 has been activated. The data also indicates to the microcontroller 120 that no further redundant systems are available. The microcontroller 120 can then store in memory a flag indicating that the reference sub-system 108 has been activated and that no further redundancies are available. The microcontroller 120 can also transmit data and commands to the integrated circuit 102. The integrated circuit 102 receives the data and commands via the transceiver 118.

In one embodiment, the control circuit 116 causes the transceiver 118 to transmit data to one or both of the remote control system 122 and the diagnostic system 124 indicating that the sub-system 104 has been deactivated and the reference system 108 has been activated. The data can also include the parameter values and the reference parameter values. The diagnostic system 124 can analyze the data and the remote control system 122 can take action with regards to other components of the system 100. The diagnostic system 124 and the remote control system 122 can also transmit data and commands to the integrated circuit 102. Although the system 100 has shown an integrated circuit with a wireless transceiver 118, other types of communication systems can be utilized. For example, the integrated circuit 102 can communicate with external systems and components via wired connections.

Figure 2:
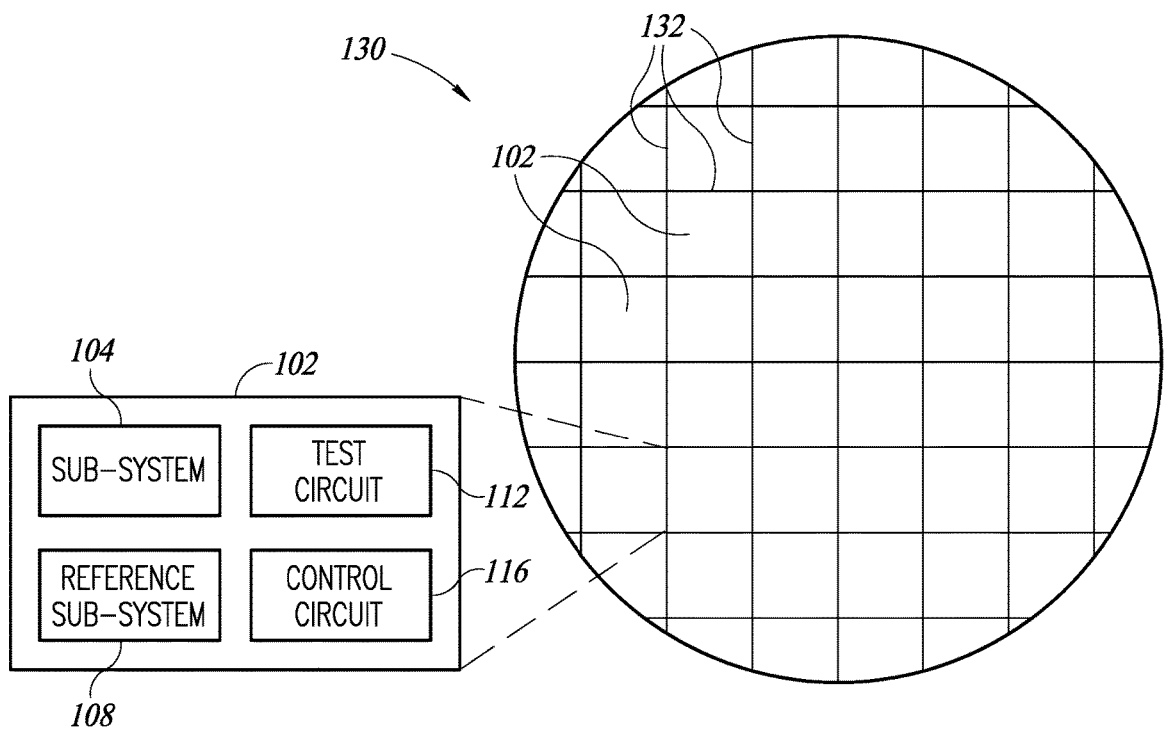
FIG. 2 is an illustration of a wafer including a plurality of integrated circuits, according to one embodiment.

FIG. 2 is an illustration of a semiconductor wafer 130, according to one embodiment. The semiconductor wafer 130 includes a plurality of integrated circuits 102. The integrated circuits 102 can each be substantially identical to each other. The integrated circuits 102 can be substantially similar to the integrated circuit 102 of FIG. 1. The integrated circuits 102 are formed while processing the semiconductor wafer 130. During processing, the semiconductor wafer 130 undergoes various steps of doping, epitaxial growth processes, thin film deposition processes, thin film etching processes, annealing processes, CHIP processes and various other types of processes to form the various components and structures of the integrated circuits 102.

After the wafer 130 has been process, the wafer 130 is diced via the scribe lines 132. The scribe lines 132 delineate the integrated circuits 102 from each other and correspond to lines by which dicing saws or other equipment will physically cut through the semiconductor wafer 130 to separate the integrated circuits 102 from each other.

Testing the function of various components of the integrated circuits 102 can be difficult. One possible solution includes forming reference circuits in the scribe lines. The reference circuits correspond to replicas of circuits, elementary structures, or sub-systems within the integrated circuits. In this solution, the sub-systems or components of the integrated circuits are tested vicariously by testing the replica circuits or reference circuits within the scribe lines prior to dicing the wafer. If the reference circuits are functional, then the individual integrated circuits are assumed to be functional. However, the solution has drawbacks. For instance, testing can only be performed before the wafer has been diced. Furthermore, the reference circuits are formed only at a few locations in the scribe lines, rather than at the location of each integrated circuit. Thus, such reference circuits may not catch malfunctions due to process variations at different locations in the wafer.

The semiconductor wafer 130 and the integrated circuits 102 of FIG. 2 overcome these drawbacks by forming reference sub-systems and reference elementary structures in each integrated circuit 102. This enables testing of sub-systems and elementary structures of the integrated circuits 102 throughout the lifetime of the integrated circuits 102, rather than only before dicing. Additionally, if deterioration is detected, the reference sub-systems or reference elementary structures can be activated to operate in place of the deteriorated sub-systems or elementary structures. Each integrated circuit 102 of the wafer 130 includes the reference sub-systems or reference elementary structures.

Figure 3A:
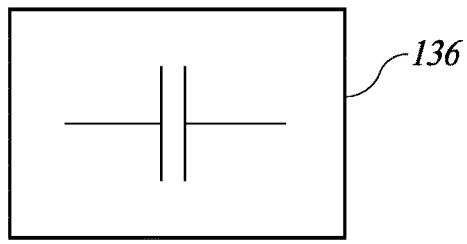
FIGS. 3A-3D include illustrations of elementary structures, according to one embodiment.

FIGS. 3A-3D are elementary structures, according to various embodiments. FIG. 3A illustrates a capacitor 136. The capacitor 136 is one example of an elementary structure 110 of FIG. 1. The capacitor 136 can include a metal-insulator-metal (MIM) capacitor. Alternatively, the capacitor 136 can include other types of capacitors. The capacitor 136 can be part of a memory cell, a sensor circuit, a mems device, or other types of circuits are systems. In an example in which the capacitor 136 is an elementary structure 110, the reference elementary structure 106 is also a capacitor that can function in place of the capacitor 136 in the event of degradation of the capacitor 136.

Figure 3B:
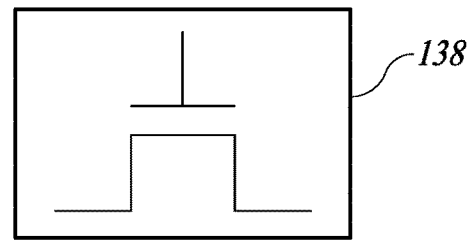

FIG. 3B illustrates a transistor 138. The transistor 138 is one example of an elementary structure 110 of FIG. 1. The transistor 138 can include a field effect transistor (FET), a bipolar transistor, or other types of transistors. The transistor 138 can be part of a memory circuit, a sensor circuit, a driver circuit, a logic circuit, or other types of circuits or systems. In an example in which the transistor 138 is an elementary structure 110, the reference elementary structure 106 is also a transistor that can function in place of the transistor 138 in the event of degradation of the transistor 138.

Figure 3C:
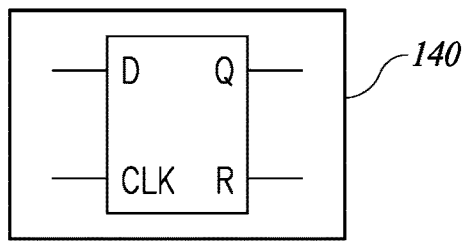

FIG. 3C illustrates a flip-flop 140. The flip-flop 140 is one example of an elementary structure 110 of FIG. 1. The flip-flop 140 can be part of a memory circuit, a sensor circuit, a driver circuit, a data output circuit, logic circuit, or other types of circuits or systems. In an example in which the flip-flop 140 is an elementary structure 110, the reference elementary structure 106 is also a flip-flop that can function in place of the flip-flop 140 in the event of degradation of the flip-flop 140.

Figure 3D:
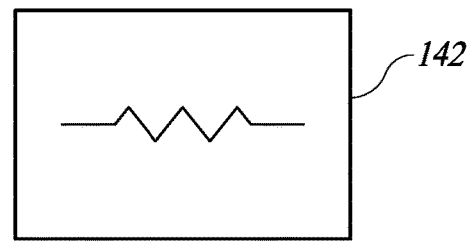

FIG. 3D illustrates a resistor 142. The resistor 142 is one example of an elementary structure 110 of FIG. 1. The resistor 142 can be part of an analog circuit, a memory circuit, a sensor circuit, a driver circuit, a data output circuit, logic circuit, or other types of circuits or systems. In an example in which the resistor 142 is an elementary structure 110, the reference elementary structure 106 is also a resistor that can function in place of the resistor 142 in the event of degradation of the resistor 142. While FIGS. 3A-3D illustrate some examples of elementary structures 110, other types of elementary structures can be utilized without departing from the scope of the present disclosure.

Figure 4:
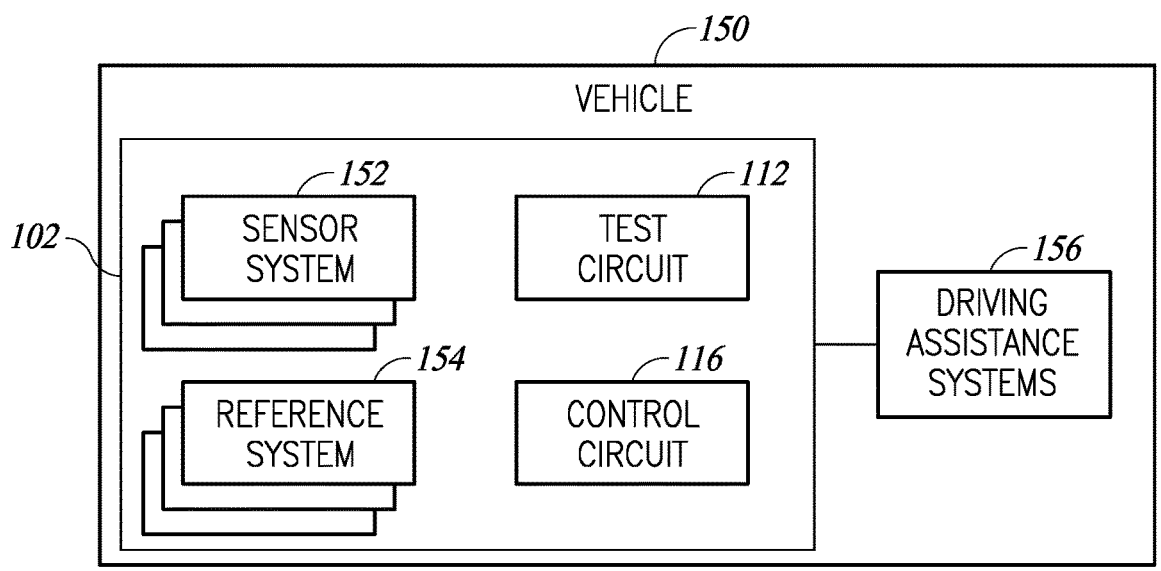
FIG. 4 is a block diagram of a vehicle, according to one embodiment.

FIG. 4 is a block diagram of a vehicle 150, according to some embodiments. The vehicle 150 includes an integrated circuit 102 and driving assistance systems 156. The vehicle can include an automobile, a watercraft, an aircraft, a public transportation vehicle, or other types of vehicles.

The vehicle 150 includes driving assistance systems 156. The driving assistance systems 156 can provide various types of assistance to the driver or pilot of the vehicle 150. The assistance can include automatic driving, collision avoidance, steering assistance, breaking assistance, acceleration assistance, audio instructions, visual indications, or other types of assistance.

The integrated circuit 102 includes one or more sensor systems 152, one or more reference systems 154, a test circuit 112, and a control circuit 116. The sensor systems 152 can be examples of a sub-system 104 of FIG. 1. The reference systems 154 can be examples of a reference system 108 of FIG. 1. The test circuit 112 and the control circuit 116 can function as described in FIG. 1. The integrated circuit 102 of FIG. 4 may include additional components of the integrated circuit 102 of FIG. 1.

The sensor systems 152 can include systems that directly sense aspects of the environment external to the vehicle 150, aspects of motion of the vehicle 150, characteristics or attentiveness of the driver or pilot, or other aspects associated with the vehicle 150. Accordingly the sensor systems 152 may include visible light sensing systems, infrared light sensing systems, ultraviolet sensing systems, radar systems, LIDAR systems, accelerometers, gyroscopes, image capture systems, temperature sensors, humidity sensors, pressure sensors, or other types of systems. Alternatively, or additionally, the sensor systems 152 can include systems or circuits that process signals or data generated by sensors external to the integrated circuit 102 that directly sense the various aspects of the vehicle 150. The sensor systems may output signals that assists the driving assistance systems 156 to provide driving assistance.

The test circuit 112 of the control circuit 116 periodically obtain a parameter values associated with the one or more sensor systems 152 and reference parameter values associated with the reference systems 154. The control circuit 116 analyzes the parameter values and the reference parameter values to determine whether deterioration of one or more the sensor systems 152 has occurred. The control circuit 116 can deactivate one or more of the sensor systems 152 and activate one or more of the reference systems 154 to operate in place of the one or more deactivated sensor systems 152, as described previously in relation to FIG. 1. The control circuit 116 can also transmit data to other systems or components of the vehicle 150 for diagnostic, messaging purposes, or remote controlling purposes.

Figure 5:
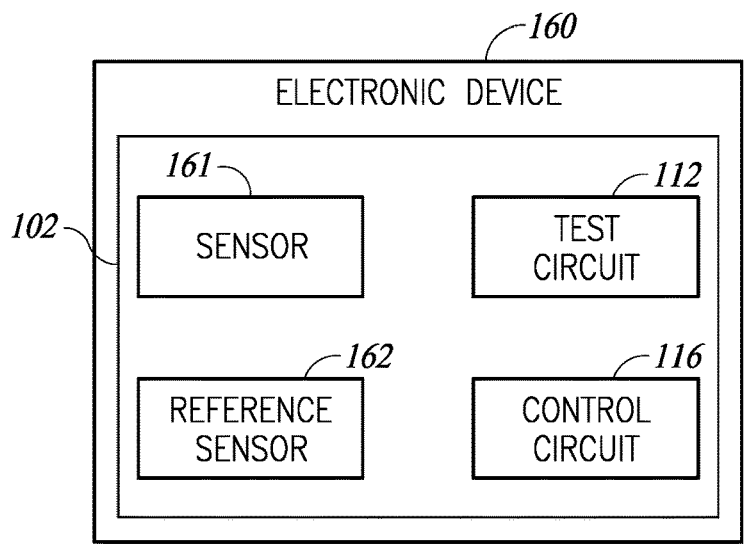
FIG. 5 is a block diagram of an electronic device, according to one embodiment.

FIG. 5 is a block diagram of an electronic device 160, according to one embodiment. The electronic device 160 includes an integrated circuit 102 that assists in performing some function of the electronic device 160. The integrated circuit 102 includes a sensor 161. The sensor 161 is one example of a sub-system 104 of FIG. 1. The integrated circuit 102 includes a reference sensor 162. The reference sensor 162 is one example of a reference sub-system 108 of FIG. 1. The integrated circuit 102 includes a test circuit 112 and a control circuit 116 can operate substantially as described in relation to FIG. 1

In one embodiment, the electronic device 160 is a medical device. The medical device can include a pacemaker, and automatic medication dispenser, a fluid flow rates sensor, a heart rate monitor, an electrocardiogram system, a blood pressure system, or other types of medical devices. In the example of a medical device, the sensor 161 can include a sensor, or a signal processing circuit for a sensor external to the integrated circuit 102, that senses aspects related to heart function, flow of medication, blood flow, blood pressure, or other aspects of health or medical device performance.

In one embodiment, the electronic device 160 is a consumer electronic device. The consumer electronic device can include a smart phone, a smartwatch, an MP3 player, smart glasses, a smart ring, a laptop computer, a desktop computer, a tablet, a television, a computer monitor, or other types of consumer electronic devices. The sensor 161 can be a sensor or a component of a sensor system that senses an aspect of the environment or function of the electronic device 160.

The test circuit 112 of the control circuit 116 periodically obtain a parameter values associated with the sensor 161 and reference parameter values associated with the reference sensor 162. The control circuit 116 analyzes the parameter values and the reference parameter values to determine whether deterioration of the sensor 161 has occurred. The control circuit 116 can deactivate the sensor 161 and activate the reference sensor 162 to operate in place of the deactivated sensor 161, as described previously in relation to FIG. 1. The control circuit 116 can also transmit data to other systems or components of the electronic device 160 for diagnostic, messaging purposes, or remote controlling purposes.

Figure 6:
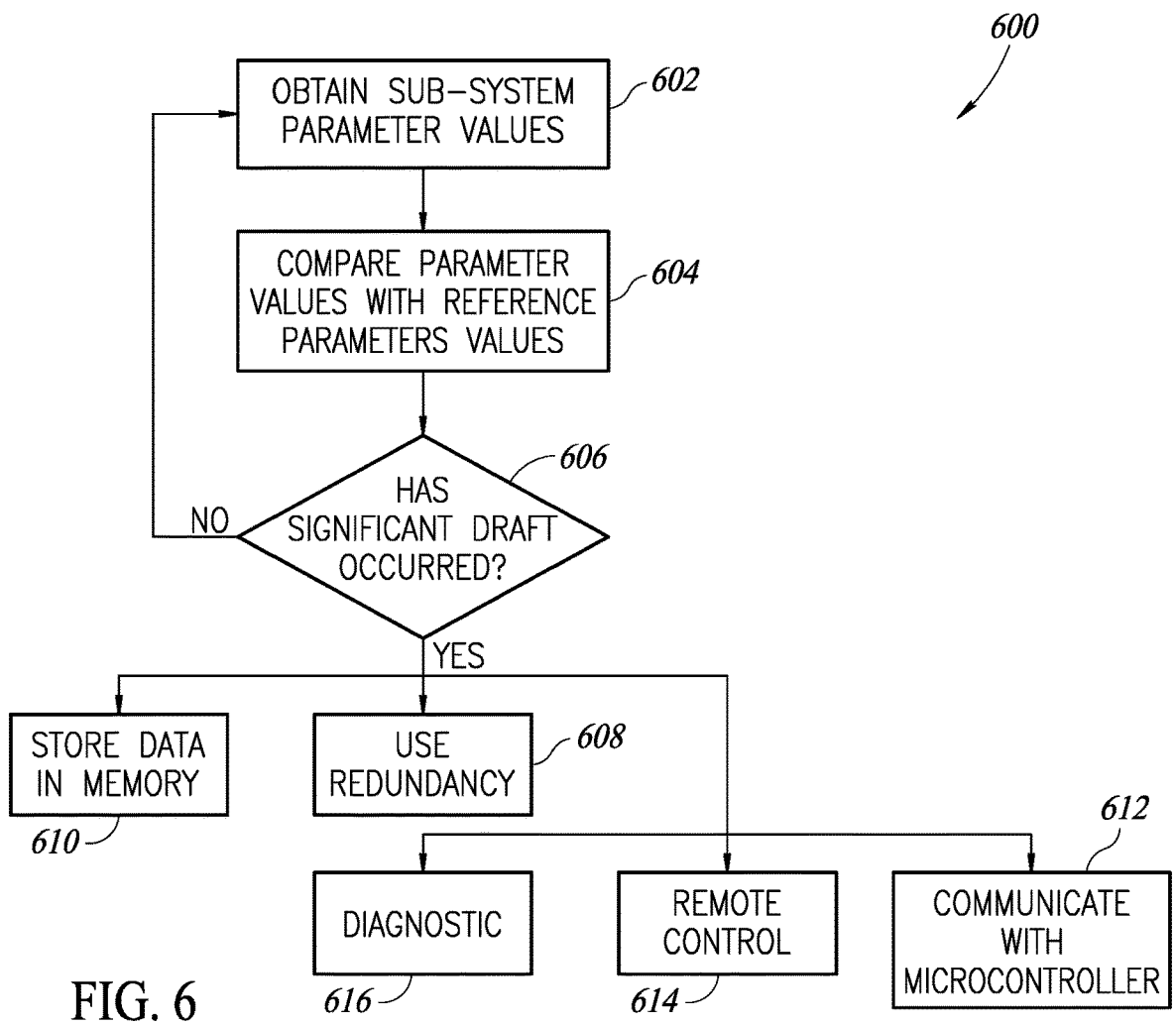
FIG. 6 is a flow diagram of a method for operating an integrated circuit, according to one embodiment.

FIG. 6 is a flow diagram of a process 600 for operating an electronic system, according to some embodiments. The process 600 can utilize components, systems, and processes described in relation to FIGS. 1-5.

At 602, an integrated circuit obtains parameter values associated with a sub-system of the integrated circuit. At 602, the integrated circuit can also obtain reference parameter values associated with a reference sub-system of the integrated circuit.

At 604, the integrated circuit compares the parameter values with the reference parameter values. As described previously, this can include calculating the difference between a parameter value and a reference parameter value and comparing the difference to previous difference values of previous sets of parameter values and reference parameter values.

At 606, the integrated circuit determines whether significant drift has occurred. This can include determining whether the difference between the parameter value and the reference parameter value has surpassed a threshold value. If no significant drift has occurred, the process returns to 602. If significant drift has occurred, then the process continues to 608.

At 608, the integrated circuit deactivates the deteriorated sub-system. The integrated circuit also activates the reference sub-system. This corresponds to using a redundancy within the integrated circuit. This is because the reference sub-system is redundant to the sub-system.

At 610, the integrated circuit stores data in a memory indicating that the sub-system has been deactivated. The data also indicates that the reference sub-system has been activated. The data can also indicate that no further redundancies are available.

At 612, the integrated circuit communicates with a microcontroller. The integrated circuit reports the deterioration of the sub-system. The integrated circuit also reports the deactivation of the sub-system and the activation of the reference sub-system. The integrated circuit may report to the microcontroller that no further redundancies are available. The microcontroller can record this information in a dedicated memory of the microcontroller.

At 614, the integrated circuit communicates with a remote control system. The integrated circuit reports the deterioration of the sub-system and provides a warning to the remote control system. The integrated circuit also reports the deactivation of the sub-system and the activation of the reference sub-system. The integrated circuit may report to the remote control system that no further redundancies are available. The remote control system can record this information in a dedicated memory of the remote control system. The remote control system may take various actions such as outputting a warning to a user of a system of which the integrated circuit as part.

At 616, the integrated circuit communicates with a diagnostic system. The integrated circuit reports the deterioration of the sub-system and provides a warning to the diagnostic system. The integrated circuit also reports the deactivation of the sub-system and the activation of the reference sub-system. The integrated circuit may report to the diagnostic system that no further redundancies are available. The integrated circuit may also provide parameter values and reference parameter values associated with the sub-system and the reference sub-system for analysis by the diagnostic system. The diagnostic system can record this information in a dedicated memory of the diagnostic system. The diagnostic system may perform analysis on the parameter values and the reference parameter values.

The description of FIG. 6 has discussed deactivating the sub-system and activating a reference sub-system. The steps of the process 600 can also apply to monitoring and deactivating an elementary structure of a sub-system and activating a reference elementary structure. The reference elementary structure may be part of a reference sub-system or may be separate from the reference sub-system.

Figure 7:
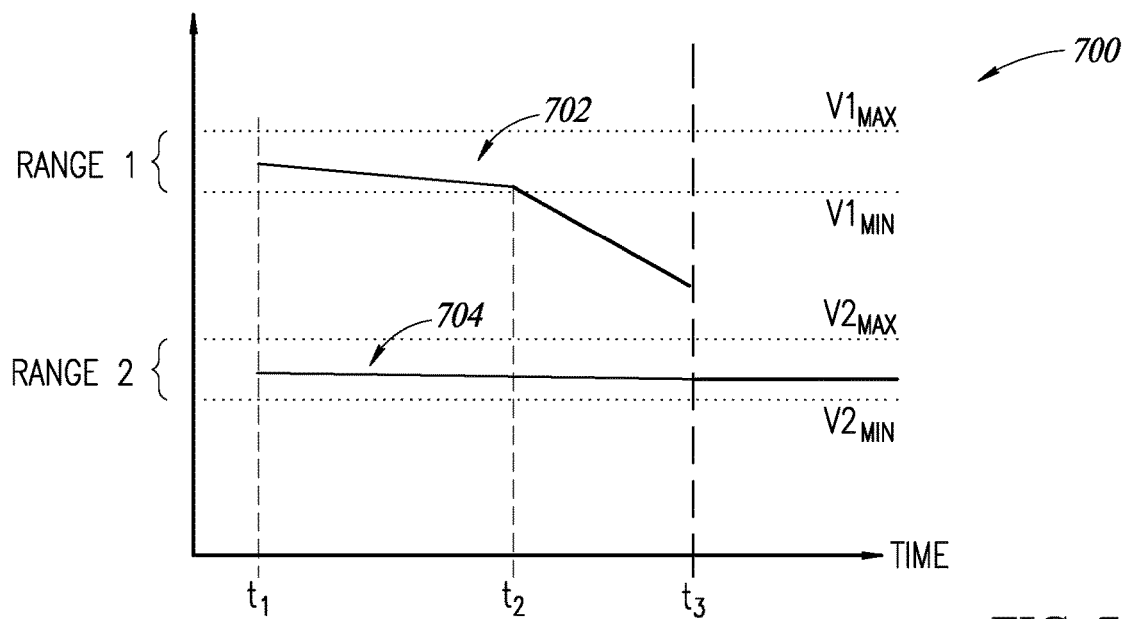
FIG. 7 is a graph illustrating parameter values of a sub-system, according to one embodiment.

FIG. 7 is a graph 700 illustrating parameter values associated with a sub-system and a reference sub-system of an integrated circuit, according to one embodiment. The graph 700 includes a curve 702 indicating a voltage value associated with a sub-system or elementary structure of an integrated circuit. In one example, the sub-system is a temperature sensor and the curve 702 illustrates voltage values associated with temperature sensor over time. These voltage values can be obtained periodically over time by a test circuit of the integrated circuit.

The graph 700 includes a curve 704 indicating a voltage value associated with a reference sub-system or elementary structure of the integrated circuit in the example in which the sub-system is a temperature sensor, the reference sub-system is a reference temperature sensor substantially identical to the temperature sensor. The curve 704 illustrates voltage values associated with the reference temperature sensor over time. These voltage values are obtained periodically over time by the test circuit of the integrated circuit.

Time t1 may correspond to a beginning of an operating lifetime of the integrated circuit. Initially, the temperature sensor associated with the curve 702 is active and the reference temperature sensor associated with the curve 704 is not active except to provide reference voltage values to the test circuit. The graph 700 illustrates a range 1 corresponding to voltage values between V1Max and V1Min. The range 1 corresponds to an expected operating range for the voltage value associated with the temperature sensor. The graph 700 illustrates a range 2 corresponding to voltage values between V2Max and V2Min. The range 2 corresponds to an operating range for the voltage value associated with the reference temperature sensor. Although range 1 is shown as being above range 2, in practice, ranges 1 and 2 may be the same.

At time t1, the curves 702 and 704 may have the same value. Over the lifetime of the integrated circuit, the voltage values associated with the temperature sensor (curve 702) decrease more rapidly than the voltage values associated with the reference temperature sensor (curve 704). This is because the temperature sensor undergoes greater stresses than the reference temperature sensor. At time t2, the voltage values associated with the temperature sensor begin to decrease rapidly and crossed below the minimum value of range 1. At time t2, the voltage values associated with the reference temperature sensor and the curve 704 remain within the expected operating range. At time t3, the voltage values associated with the temperature sensor in curve 702 have drifted with respect to the voltage values of the reference temperature sensor and curve 704 beyond a threshold value. At this time, the integrated circuit deactivates the temperature sensor and activates the reference temperature sensor to operate in place of the temperature sensor. Thus the curve 702 does not extend beyond time t3, while the curve 704 continues beyond time t3.

Although examples of a temperature sensor have been given with respect to FIG. 7, other types of sub-systems or elementary structures and other types of signals can be utilized to detect and deterioration of a sub-system or elementary structure.

Figure 8:
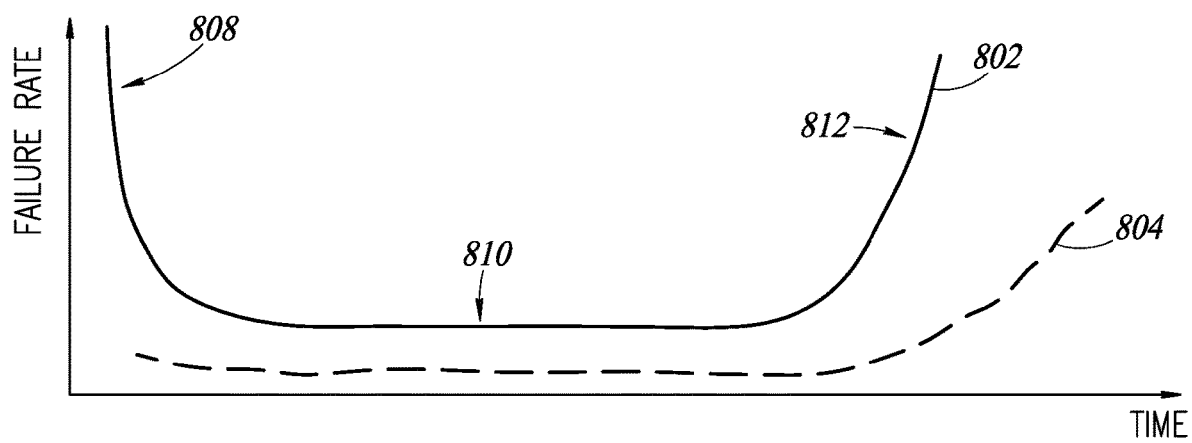
FIG. 8 is a graph illustrating failure rates associated integrated circuits, according to one embodiment.

FIG. 8 is a graph illustrating failure rates associated with sub-systems of an integrated circuit, according to one embodiment. The curve 802 illustrates failure rates of a traditional integrated circuit that includes a sub-system, but does not include a reference-sub-system and the corresponding testing as described in relation to FIGS. 1-7. The curve 804 illustrates failure rates of an integrated circuit including a sub-system and a reference sub-system and the corresponding testing and replacement, as described in relation to FIGS. 1-7.

The area 808 of the graph 802 illustrates that the traditional integrated circuit has a high failure rate at infancy due to the fact that a faulty sub-system may fail immediately. As there is no reference sub-system available for replacement in the traditional integrated circuit, the traditional integrated circuit has a high failure rate early in his lifetime. The area 810 of the graph 802 illustrates that if the sub-system does not fail in its infancy in the traditional integrated circuit, the sub-system will likely not fail for some time and thus a low failure rate occurs in the middle lifespan of the integrated circuits. The area 812 of the graph 802 indicates an increasing failure rate of the traditional integrated circuit as the sub-system wears out due to stress and there is no reference sub-system for placement.

The graph 804 illustrates that an integrated circuit in accordance with principles of the present disclosure has a lower failure rate at infancy due to the availability of testing of the sub-system and replacing of the sub-system with a reference sub-system. The failure rate of the integrated circuit in accordance with principles of the present disclosure is also significantly less than the traditional integrated circuit in the middle lifespan due to the testing and presence of the reference sub-system. The integrated circuit in accordance with principles of the present disclosure also has a much lower failure rate as time goes on and has a much longer overall lifetime due to the presence of the reference sub-system in the testing of the sub-system, as described in relation to FIGS. 1-7.

The graphs 802 and 804 of FIG. 8 illustrates that principles of the present disclosure result in integrated circuits having significantly lower failure rates and significantly longer lifespans than traditional integrated circuits that do not implement principles of the present disclosure.

Figure 9:
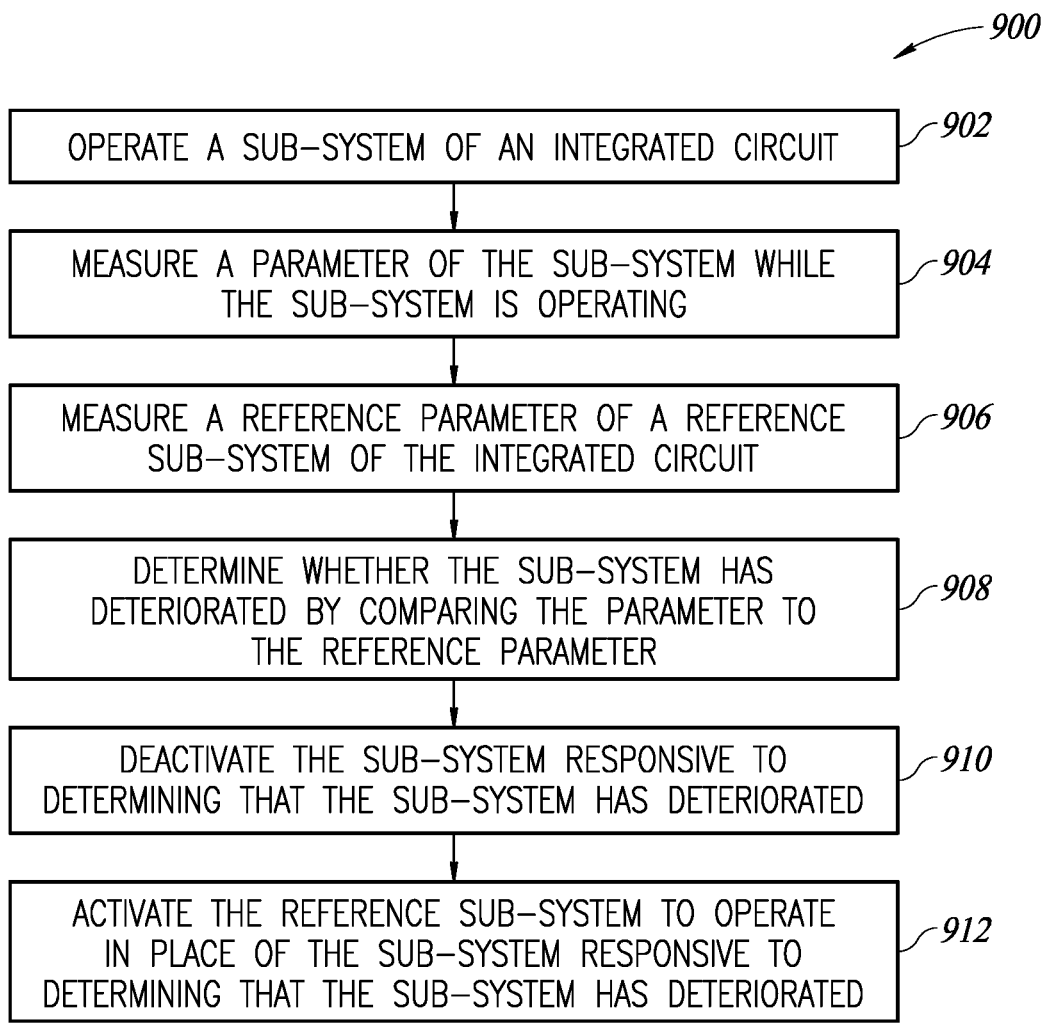
FIG. 9 is a flow diagram of a method for operating integrated circuit, according to one embodiment.

FIG. 9 is a flow diagram of a method 900 for operating an integrated circuit, according to one embodiment. The method 900 can utilize systems, components, and processes described in relation to FIGS. 1-8. At 8 902, the method 900 includes operating a sub-system of an integrated circuit. At 904, the method 900 includes measuring a parameter of the sub-system while the sub-system is operating. At 906, the method 900 includes measuring a reference parameter of a reference sub-system of the integrated circuit. At 908, the method 900 includes determining whether the sub-system has deteriorated by comparing the parameter to the reference parameter. At 910, the method 900 includes deactivating the sub-system responsive to determining that the sub-system has deteriorated. At 912, the method 900 includes activating the reference sub-system to operate in place of the sub-system responsive to determining that the sub-system has deteriorated.

In one embodiment, an integrated circuit includes a sub-system, a reference sub-system, and a test circuit coupled to the sub-system and the reference sub-system and configured to obtain a parameter value from the sub-system and a reference parameter value from the reference sub-system. The integrated circuit further includes a control circuit coupled to the test circuit and configured to compare the parameter value to the reference parameter value.

In one embodiment, an integrated circuit includes a sub-system including an elementary structure, a reference elementary structure, and a test circuit coupled to the sub-system and the reference elementary structure and configured to measure a parameter of the elementary structure and to measure a reference parameter of the reference elementary structure. The integrated circuit further includes a control circuit coupled to the test circuit and configured to determine whether the elementary structure has deteriorated based on the parameter and the reference parameter.

In one embodiment, a method includes operating a sub-system of an integrated circuit and measuring a parameter of the sub-system while the sub-system is operating the method includes measuring a reference parameter of a reference sub-system of the integrated circuit and determining whether the sub-system has deteriorated by comparing the parameter to the reference parameter.

In one embodiment, a vehicle includes an integrated circuit. The integrated circuit includes a sensor system, a reference system capable of performing a function of the sensor system, and a control circuit. The control circuit is configured to obtain a parameter of the sensor sub-system while the system is operating, obtain a reference parameter of the reference system, and detect deterioration of the sensor sub-system based on the parameter and the reference parameter. The control circuit is configured to deactivate the sensor system if control circuit detects deterioration and activate the reference system in place of the sensor sub-system if the control signal detects deterioration of the sensor system.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a sub-system;
   a reference sub-system, wherein the reference sub-system is capable of performing a function of the sub-system and is inactive within the integrated circuit by default;
   a test circuit coupled to the sub-system and the reference sub-system and configured to obtain a parameter value from the sub-system and a reference parameter value from the reference sub-system;
   a control circuit coupled to the test circuit and configured to compare the parameter value to the reference parameter value and to determine whether the sub-system has deteriorated based on the parameter value and the reference parameter value.

2. The integrated circuit of claim 1, wherein the control circuit is configured to cause the sub-system to cease operating and to cause the reference sub-system to begin operating in place of the sub-system if the control circuit determines that the sub-system has deteriorated.

3. The integrated circuit of claim 1, comprising a memory, wherein the control circuit stores in the memory previous values of the parameter value and the reference parameter value and determines whether the sub-system has deteriorated based on a difference between the parameter value and the reference parameter value and based on differences between the previous pairs of parameter values and reference parameter values.

4. The integrated circuit of claim 1, comprising a transceiver configured to transmit the parameter value and the reference parameter value to an external system.

5. The integrated circuit of claim 4, wherein the transceiver is configured to receive control signals from the external system, wherein the control circuit is configured to cause the reference sub-system to begin operating in place of the sub-system responsive to the control signals.

6. The integrated circuit of claim 1, wherein the sub-system includes a component of a sensor system and the reference sub-system includes a reference component capable of replacing the component in the sensor system.

7. The integrated circuit of claim 6, wherein the sensor system includes one or more of radar, LIDAR, infrared sensors, ultraviolet sensors, and visible light sensors.

8. An integrated circuit, comprising:
   a sub-system including an elementary structure;
   a reference elementary structure;
   a test circuit coupled to the sub-system and the reference elementary structure and configured to measure a parameter of the elementary structure and to measure a reference parameter of the reference elementary structure; and
   a control circuit coupled to the test circuit and configured to determine whether the elementary structure has deteriorated based on the parameter and the reference parameter.

9. The integrated circuit of claim 8, wherein the control circuit is configured to deactivate the elementary structure in the sub-system and to activate the reference elementary structure in the sub-system in place of the elementary structure if the control circuit determines that the elementary structure has deteriorated.

10. The integrated circuit of claim 8, comprising a reference sub-system including the reference elementary structure, wherein the control circuit is configured to deactivate the sub-system and to activate the reference sub-system in place of the sub-system if the control circuit determines that the elementary structure has deteriorated.

11. The integrated circuit of claim 8, wherein the elementary structure includes a capacitor.

12. The integrated circuit of claim 8, wherein the elementary structure includes a transistor.

13. The integrated circuit of claim 8, wherein the elementary structure includes a flip-flop.

14. The integrated circuit of claim 8, wherein the elementary structure includes a resistor.

15. A method, comprising:
    operating a sub-system of an integrated circuit;
    measuring a parameter of the sub-system while the sub-system is operating;

measuring a reference parameter of a reference sub-system of the integrated circuit;
determining whether the sub-system has deteriorated by comparing the parameter to the reference parameter;
deactivating the sub-system responsive to determining that the sub-system has deteriorated; and
activating the reference sub-system to operate in place of the sub-system responsive to determining that the sub-system has deteriorated.

16. The method of claim 15, comprising:
controlling, prior to deactivating the sub-system, an aspect of a vehicle that includes the integrated circuit based on an operation of the sub-system; and
controlling, after deactivating the sub-system and activating the reference sub-system, the aspect of the vehicle based on an operation of the reference sub-system.

\* \* \* \* \*